(12) United States Patent
Gao et al.

(10) Patent No.: US 7,830,498 B2
(45) Date of Patent: Nov. 9, 2010

(54) HYDRAULIC-FACILITATED CONTACT LITHOGRAPHY APPARATUS, SYSTEM AND METHOD

(75) Inventors: Jun Gao, Palo Alto, CA (US); Wei Wu, Palo Alto, CA (US); Carl Picciotto, Palo Alto, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 1002 days.

(21) Appl. No.: 11/548,216

(22) Filed: Oct. 10, 2006

(65) Prior Publication Data

US 2008/0084006 A1    Apr. 10, 2008

(51) Int. Cl.
*G03B 27/20* (2006.01)
*G03B 27/02* (2006.01)
*G03B 27/58* (2006.01)
*G03B 27/60* (2006.01)
*G03B 27/62* (2006.01)
*G03B 27/64* (2006.01)

(52) U.S. Cl. .................. 355/91; 355/72; 355/73; 355/75; 355/76; 355/78

(58) Field of Classification Search .......... 355/78, 355/80, 81, 84–87, 91, 94, 99, 104, 118, 355/122, 132, 53, 72–76; 430/5, 22, 311, 430/313, 322; 425/405.1, 387.1, 149; 264/293, 264/299
See application file for complete search history.

(56) References Cited

U.S. PATENT DOCUMENTS

| | | | | |
|---|---|---|---|---|
| 4,026,653 A | * | 5/1977 | Appelbaum et al. | ......... 355/132 |
| 4,054,383 A | * | 10/1977 | Lin et al. | ............. 355/91 |
| 4,312,823 A | * | 1/1982 | Kraakman et al. | ......... 264/107 |
| 4,360,266 A | * | 11/1982 | Takeuchi | ............. 355/91 |
| 5,160,959 A | | 11/1992 | Everett et al. | |
| 5,164,284 A | * | 11/1992 | Briguglio et al. | ............ 430/258 |
| 6,187,482 B1 | * | 2/2001 | Kuroda et al. | ................ 430/5 |
| 6,232,023 B1 | * | 5/2001 | Matsuki et al. | .............. 430/22 |
| 6,294,450 B1 | | 9/2001 | Chen et al. | |
| 6,459,474 B1 | * | 10/2002 | Okada | .......... 355/78 |
| 6,482,742 B1 | | 11/2002 | Chou | |
| 6,707,538 B2 | * | 3/2004 | Naya | .......... 355/71 |
| 6,713,238 B1 | | 3/2004 | Chou et al. | |

(Continued)

FOREIGN PATENT DOCUMENTS

EP    0953878    11/1999

(Continued)

OTHER PUBLICATIONS

D. J. Resnick et al., "Imprint lithography for integrated circuit fabrication," J. Vac. Sci. Technol., B 21(6), Nov./Dec. 2003, pp. 2624-2631.

(Continued)

*Primary Examiner*—Peter B Kim
*Assistant Examiner*—Christina Riddle

(57) ABSTRACT

A contact lithography apparatus, system and method use a hydraulic deformation to facilitate pattern transfer. The apparatus, system and method include a spacer that provides a spaced apart proximal orientation of lithographic elements, and a hydraulic force member that provides the hydraulic deformation. One or more of the lithographic elements and the spacer is deformable, such that hydraulic deformation thereof facilitates the pattern transfer.

20 Claims, 8 Drawing Sheets

U.S. PATENT DOCUMENTS

| | | |
|---|---|---|
| 6,719,915 B2 | 4/2004 | Wilson et al. |
| 6,784,979 B2 * | 8/2004 | Tajima et al. .................. 355/78 |
| 6,814,898 B1 | 11/2004 | Deeman et al. |
| 6,961,186 B2 | 11/2005 | Pierrat et al. |
| 6,994,541 B2 | 2/2006 | Chung et al. |
| 7,306,742 B2 * | 12/2007 | Nebashi et al. ................ 216/12 |
| 2005/0057752 A1 * | 3/2005 | Inao et al. .................... 356/400 |
| 2005/0213073 A1 * | 9/2005 | Vibet et al. ................... 355/403 |
| 2006/0033896 A1 * | 2/2006 | Kiriya ........................ 355/53 |
| 2006/0043626 A1 | 3/2006 | Wu et al. |
| 2006/0119817 A1 | 6/2006 | Maria Hennus et al. |
| 2006/0158628 A1 | 7/2006 | Maria Liebregts et al. |
| 2010/0021577 A1 * | 1/2010 | Stewart et al. .................. 425/3 |

FOREIGN PATENT DOCUMENTS

| | | |
|---|---|---|
| EP | 1376235 | 1/2004 |
| WO | WO 02/07199 | 1/2002 |
| WO | WO 2005/054948 | 6/2005 |

OTHER PUBLICATIONS

Xing Cheng et al., "One-step lithography for various size patterns with a hybrid mask-mold," Microelectronic Engineering, 71, 2004, pp. 288-293.

* cited by examiner

HYDRAULIC-FACILITATED CONTACT LITHOGRAPHY APPARATUS, SYSTEM AND METHOD

CROSS-REFERENCE TO RELATED APPLICATIONS

N/A

STATEMENT REGARDING FEDERALLY SPONSORED RESEARCH OR DEVELOPMENT

N/A

BACKGROUND

1. Technical Field

The invention relates to semiconductors and the fabrication thereof. In particular, the invention relates to lithography used to define one or both of micro-scale and nano-scale structures during semiconductor fabrication.

2. Description of Related Art

Photographic contact lithography and imprint lithography are examples of two lithography methodologies for defining micro-scale and nano-scale structures that generally involve direct contact between a patterning tool (e.g., mask, mold, template, etc.) and a substrate on which the structures are to be fabricated. In particular, during contact lithography, the patterning tool (i.e., mask) is aligned with and then brought in contact with the substrate or a pattern receiving layer of the substrate. Similarly, in imprint lithography, the patterning tool (i.e., mold) is aligned with the substrate after which the pattern is printed on or impressed into a receiving surface of the substrate. With either method, alignment between the patterning tool and the substrate general involves holding the patterning tool a small distance above the substrate while lateral and rotational adjustments (e.g., x-y translation and angular rotation) are made to a relative position of one or both of the tool and the substrate. The patterning tool is then brought in contact with the substrate to perform the lithographic patterning.

In both of contact lithography and imprint lithography, an ultimate 5 alignment accuracy as well as an achievable patterning resolution may be affected by a degree to which the patterning tool and substrate are both mutually parallel and proximal during the alignment process. In addition, accuracy and resolution depend on maintaining an achieved alignment during contact lithography. In particular, accuracy and resolution may suffer as a result of drift or slip in the relative positioning of the aligned patterning tool and substrate that may occur as the tool is brought into contact with the substrate following an initial alignment.

Furthermore, thermal gradients (both static and dynamic) as well as mechanical and acoustic vibration often lead to or result in thermo-instability and/or vibrational instability during contact lithography. Thermo-instability and vibrational instability can further degrade or otherwise adversely affect one both of the ultimate alignment accuracy and the achievable patterning resolution.

BRIEF SUMMARY

In some embodiments of the present invention, a contact lithography apparatus is provided. The contact lithography apparatus comprises a patterning tool having a patterned area with a lithographic pattern and a substrate being patterned. The contact lithography apparatus further comprises a spacer disposed between the patterning tool and the substrate, the spacer providing a spaced apart proximal orientation of the patterning tool and the substrate when the patterning tool and the substrate are in mutual contact with the spacer. The contact lithography apparatus further comprises a hydraulic force member adjacent to one or both of the patterning tool and the substrate that applies a hydraulic deformation force. One or more of the patterning tool, the substrate and the spacer is deformable, such that hydraulic deformation facilitates pattern transfer.

In other embodiments of the present invention, a contact lithography system is provided. The contact lithography system comprises a contact lithography module and a contact mask aligner that supports the contact lithography module. The contact lithography module comprises a spacer, a plurality of lithographic elements and a hydraulic force member. The spacer is located between the lithographic elements while the hydraulic force member is adjacent to one or more of the lithographic elements. The spacer provides a spaced apart proximal orientation of the lithographic elements during an alignment of the lithographic elements by the aligner. A hydraulic force of the hydraulic force member produces a hydraulic deformation in the module to transfer a pattern while the aligner holds the elements in alignment.

In other embodiments of the present invention, a method of contact lithography is provided. The method comprises orienting a lithographic patterning tool and a substrate being patterned in a spaced apart relationship using a dimensioned spacer, the patterning tool and the substrate being in mutual contact with the spacer. The method further comprises hydraulically inducing a deformation of one or more of the patterning tool, the substrate and the spacer, such that the patterning tool and the substrate are brought into direct contact for pattern transfer.

Certain embodiments of the present invention have other features that are one or both of in addition to and in lieu of the features described hereinabove. These and other features of the invention are detailed below with reference to the following drawings.

BRIEF DESCRIPTION OF THE DRAWINGS

The various features of embodiments of the present invention may be more readily understood with reference to the following detailed description taken in conjunction with the accompanying drawings, where like reference numerals designate like structural elements, and in which.

DETAILED DESCRIPTION

Figure 1:
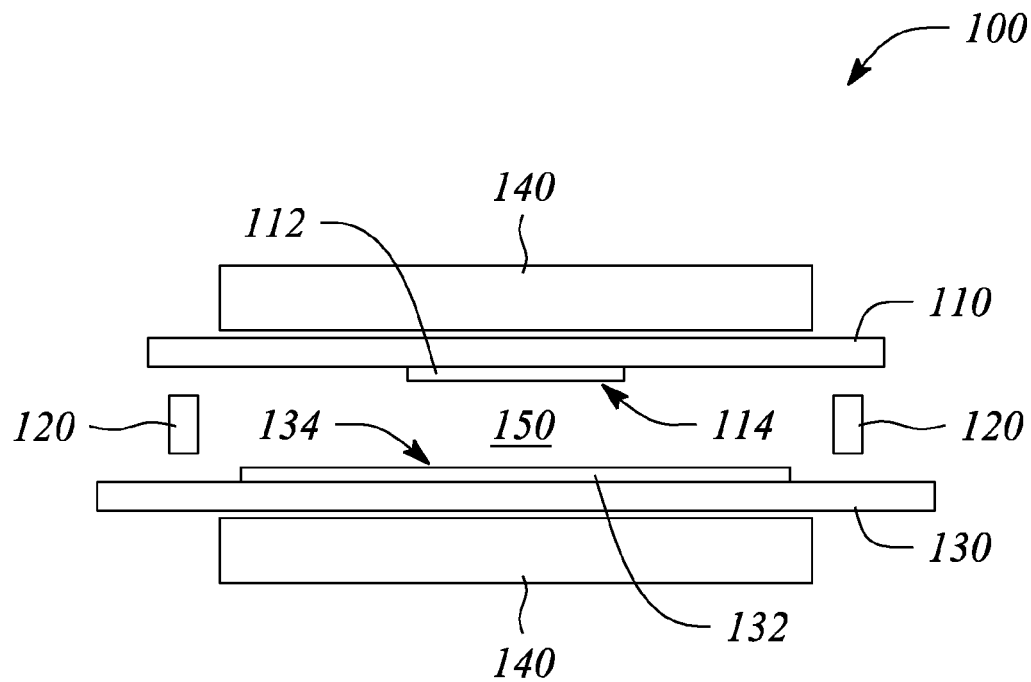
FIG. 1 illustrates a side view of a contact lithography apparatus according to an embodiment of the present invention.

The embodiments of the present invention facilitate patterning a substrate using lithography involving contact between a patterning tool and a substrate. In various embodiments, the present invention employs a hydraulic fluid or liquid and one or more spacers between the patterning tool and the substrate. The spacers are employed between the patterning tool and the substrate to establish a spaced apart and proximal orientation therebetween. In some embodiments, the spacers establish a parallel and proximal alignment between the patterning tool and the substrate. The spaced apart and proximal orientation provided by the spacers is readily maintained during one or both of lateral and rotational adjustments between the patterning tool and the substrate to establish a target alignment of the tool and the substrate.

In addition, according to various embodiments of the present invention, a flexure or deformation of one or more of the patterning tool, the substrate, and the spacer facilitates contact between the substrate and the patterning tool during pattern transfer. The flexure-facilitated contact has little or no adverse effect on the previously established lateral and rotational alignment according to various embodiments of the present invention. Contact lithography employing flexure-facilitated contact is described by Stewart et al. in co-pending U.S. patent application Ser. No. 11/203,551, filed Aug. 12, 2005, incorporated herein by reference in its entirety (hereinafter 'Stewart et al.').

According to various embodiments of the present invention, the flexure or deformation of one or more of the patterning tool, the substrate, and the spacer is provided by a deformation force applied using the hydraulic liquid. As such, the flexure or deformation is sometimes referred to herein as 'hydraulically induced' flexure or deformation or 'hydraulic flexure' or 'hydraulic deformation'. In some embodiments, the hydraulic liquid further contributes to a thermo-stability of the apparatus. In some embodiments, the hydraulic liquid further contributes to a vibration isolation or stability of the apparatus. In some embodiments, the hydraulic liquid facilitates optical alignment of the patterning tool and the substrate. As such, the potential enhancing effects of thermo-stabilization, vibration reduction and optical alignment provided by the hydraulic liquid may reduce problems of alignment and stability related to vibration and temperature during contact lithography, in some embodiments.

For example, in some embodiments, the hydraulic liquid being present during alignment may result in lithographic elements (e.g., the patterning tool and the substrate) being at essentially the same temperature, thus reducing alignment errors associated with temperature differences among the lithographic elements. In some embodiments, the hydraulic liquid may further dampen vibration impinging upon the patterning tool, the spacer, and the substrate, thus reducing differential vibration-induced alignment errors that are present in conventional contact lithography apparatuses and systems. In some of these embodiments, the differential vibration-induced alignment errors are minimized.

In various embodiments, the hydraulic liquid is adjacent to or proximal to a surface of one of both of the patterning tool and the substrate, such that the hydraulic liquid is able to apply a force to the respective adjacent surfaces in an essentially direct manner. In particular, the hydraulic liquid is variously in contact with one or both the patterning tool and the substrate, according to embodiments of the present invention. In some embodiments, the 'contact' is a 'direct contact' while in other embodiments, the contact is an 'indirect contact'.

By 'direct contact' it is meant that the hydraulic liquid physically contacts a surface of one or more of the substrate and the patterning tool. For example, the hydraulic liquid may be in direct contact with a surface of the patterning tool that is opposite to a patterning surface thereof. The term 'indirect contact' is defined herein as an essentially intimate contact but not direct contact. In particular, for 'indirect contact' the hydraulic liquid is adjacent or proximal to but separated from a surface. For example, a membrane may separate the hydraulic liquid from a surface of one of both of the substrate and the patterning tool. The exemplary membrane prevents direct contact and thus provides 'indirect contact'. In another example of indirect but intimate contact, the substrate may be mounted to a carrier (e.g., substrate chuck). The hydraulic liquid may be in contact, either direct contact or indirect contact, with the carrier while the carrier is in contact with the substrate. As such, the contact between the hydraulic liquid and the substrate is an indirect contact in this example.

However, excluded from the meaning of 'indirect contact', as used herein, is a hydraulic liquid contained in a reservoir that is essentially remote from and connected to the apparatus by way of a force communicating element. Such contact through a force communicating element is referred to herein as a 'point contact' or a 'remote contact' to distinguish it from 'indirect contact' defined above. For example, consider a cylinder (i.e., reservoir) that comprises a hydraulic liquid and further comprises a piston having a piston rod. A force exerted by the hydraulic liquid that is communicated using the piston rod connected to a surface of the apparatus represents or exemplifies remote contact, by definition according to the present invention. In particular, a force exerted by the hydraulic liquid acts on the piston which, in turn, acts on the piston rod and that acts on the apparatus surface. The presence of the piston and the piston rod between the hydraulic liquid and the surface of the apparatus effectively means that the hydraulic liquid is not adjacent to the surface. On the other hand, the example of a membrane separating the hydraulic liquid and the surface is indirect contact since only a relatively small distance separates the hydraulic liquid from the apparatus surface. Additional examples and discussion herein will further serve to distinguish 'remote contact' from 'indirect contact'.

Herein, the term 'hydraulic liquid' includes any liquid or liquid/gas combination that may be employed or capable of being employed to apply a deformation force during flexure-facilitated contact according to the present invention. In some embodiments, the hydraulic liquid may comprise a material having both a liquid phase and a gaseous phase, the gaseous phase being present concomitant with the liquid phase either within the hydraulic liquid itself or along with the hydraulic liquid in container housing or otherwise containing the hydraulic liquid.

As such, the hydraulic liquid may comprise conventional hydraulic fluids used in hydraulic systems such as, but not limited to mineral oil, organophosphate ester (e.g., as described in MIL-H-19457, incorporated herein by reference), and polyalphaolefin. In addition, the hydraulic liquid may comprise various other liquids and semi-liquids (e.g., gels and pastes) such as, but not limited to, water, ethylene glycol and polyethylene glycol compounds, glycol ethers, mineral oil, fluorocarbon and perfluorocarbon fluids, silicone fluids, and various petroleum-based fluids (e.g., oil, grease, etc.). For example, a perfluorocarbon fluid such as Fluorinert™ (e.g., FC-72 or perflourohexane) manufactured by 3M Company, St. Paul, Minn., may be employed as the hydraulic liquid in some embodiments.

In general, choice of a particular or specific hydraulic liquid may be constrained such that the liquid chosen does not significantly degrade or otherwise chemically attack elements into which the liquid may come in contact during flexure facilitated contact lithography according to the present invention. The list of materials presented above is not intended to be either exhaustive or limiting.

Herein, a 'hydraulic force member' is any structure comprising a hydraulic liquid that facilitates applying hydraulic force using the hydraulic liquid. In particular, the hydraulic force member enables the hydraulic liquid to apply the deformation force during flexure-facilitated contact. Furthermore, the hydraulic force member is defined as a structure that enables the hydraulic liquid to be in contact with one or more of the substrate and the patterning tool. Specifically, the enabled contact provided for by the hydraulic force member is either a direct contact or an indirect contact as defined above.

Herein, the term 'deformation' generally includes within its scope one or both of a plastic deformation and an elastic deformation in response to an applied deformation force. Herein, the term 'deformation' further generally includes within its scope one or both of a passive deformation and an active deformation. According to various embodiments, the deformation force is provided in part or in whole by the hydraulic liquid.

Further herein, the term 'contact lithography' generally refers to essentially any lithographic methodology that employs a direct or physical contact between means for providing a pattern or the patterning tool and means for receiving the pattern or the substrate, including a substrate having a pattern receiving layer, without limitation. Specifically, 'contact lithography' as used herein includes, but is not limited to, various forms of photographic contact lithography, X-ray contact lithography, and imprint lithography. Imprint lithography includes, but is not limited to, micro-imprint lithography and nano-imprint or nano-scale imprint lithography (NIL).

For example, in photographic contact lithography, a physical contact is established between a photomask (i.e., the patterning tool) and a photosensitive resist layer on the substrate (i.e., the pattern receiving means). During the physical contact, visible light, ultraviolet (UV) light, or another form of radiation passing through the photomask exposes the photoresist. As a result, a pattern of the photomask is transferred to the substrate. In imprint lithography, a mold (i.e., the patterning tool) transfers a pattern to the substrate through an imprinting process, for example. In some embodiments, a physical contact between the mold and a layer of formable or imprintable material on the substrate (i.e., the pattern receiving means), transfers the pattern to the substrate.

For simplicity herein, no distinction is made between the substrate and any layer or structure on the substrate (e.g., photoresist layer or imprintable material layer) unless such a distinction is necessary for proper understanding. As such, the pattern receiving means is generally referred to herein as a 'substrate' irrespective of whether a resist layer or a formable layer may be employed on the substrate to receive the pattern. Moreover, the patterning tool (e.g., photomask, X-ray mask, imprint mold, template, etc.) is also referred to herein as either a 'mold' or a 'mask' for simplicity of discussion and not by way of limitation. Examples described herein are provided for illustrative purposes only and not by way of limitation.

FIG. 1 illustrates a side view of a contact lithography apparatus 100 according to an embodiment of the present invention. The contact lithography apparatus 100 comprises a patterning tool or 'mold' 110 and one or more spacers 120. The contact lithography apparatus 100 copies, prints, imprints or otherwise transfers a pattern from the mold 110 to a substrate 130. In particular, a direct contact between the mold 110 and the substrate 130 is employed during a pattern transfer associated with the contact lithography performed by apparatus 100. In some embodiments, the spacers 120 are rigid spacers while in other embodiments the spacers 120 are substantially non-rigid or deformable spacers.

The contact lithography apparatus 100 further comprises a hydraulic force member 140 adjacent to one or both of the mold 110 and the substrate 130. The hydraulic force member 140 comprises a hydraulic liquid. The hydraulic force member 140 exerts or applies a deformation force to a respective surface of one or both of the adjacent mold 110 and the adjacent substrate 130 to facilitate contact (e.g., pattern transfer) during contact lithography. For example, a pressure of the hydraulic liquid on an interface between the respective surface and the hydraulic force member 140 results in an application of the deformation force.

In some embodiments, the contact lithography apparatus 100 further comprises an immersion fluid 150 between the mold 110 and the substrate 130. In some embodiments, the immersion fluid 150 is essentially similar to the hydraulic liquid 142 except that the immersion fluid 150 is not adapted to exert a deforming force.

In the contact lithography apparatus 100, the spacers 120 are located between the mold 110 and the substrate 130 prior to and during pattern transfer. The spacers 120 initially provide for and maintain an essentially defined separation between the mold 110 and the substrate 130. Specifically, the spacers 120 disposed between the mold 110 and substrate 130 provide a spaced apart and proximal orientation of the mold 110 and substrate 130 when the mold 110 and the substrate 130 are in mutual contact with the spacers 120. In some embodiments, the spacers 120 provide for and maintain an essentially parallel and proximal separation between the mold 110 and the substrate 130.

During contact lithography, a deformation of one or more of the mold 110, the spacers 120, and the substrate 130 facilitates the pattern transfer by enabling the mold 110 and the substrate 130 to contact one another. The pattern being transferred is 'carried' by a patterned area, region, or portion 112 of the mold 110. The pattern being transferred is received by a receiving or target area, region, or portion 132 of the substrate 130. While contacting one another, a contacting surface 114 of the mold 110 is in direct contact with a contacting surface 134 of the substrate 130 to facilitate pattern transfer. According to various embodiments of the present invention, the deformation is a result of a deformation force provided by the hydraulic force member 140.

For example, in some embodiments, one or both a flexible mold 110 and a flexible substrate 130 are employed. In some of these embodiments, the spacer 120 is a rigid spacer 120 (i.e., a non-deformable or non-flexible spacer). In another embodiment, a deformable (e.g., collapsible) spacer 120 is employed. In yet other embodiments, a combination of one or more of a flexible mold 110, a flexible substrate 130 and a deformable spacer 120 are employed. In embodiments that include the combination, rigidity may be provided by a plate or carrier (e.g., mask blank, substrate chuck, armature frame, etc.) that supports one or both of the mold 110 and the substrate 130 during pattern transfer, as described below. Pattern transfer occurs while the mold 110 and the substrate 130 are in direct contact at the contacting surfaces 114, 134, as a result of the flexure and/or deformation in response to the hydraulic deformation force.

In some embodiments, especially where flexure of one or both of the mold 110 and the substrate 130 are employed, the flexure may occur between or within a region encompassed or bounded by the spacers 120. For example, the spacers 120 may be located at a periphery of one or both of the patterned region 112 of the mold 110 and the target area 132 of the substrate 130 and the flexure of one or both of the mold 110 and the substrate 130 occurs within the periphery.

In some embodiments, deformable spacers 120 are employed, and one or both of an essentially non-deformable mold 110 and an essentially non-deformable substrate 130 may be used. For example, a semi-rigid or rigid mold 110 that is not deformed, or not intended to be deformed, during pattern transfer may be the non-deformable mold 110. Furthermore, in some embodiments that use the deformable, spacer 120, one or more of the spacers 120 may be located within a broader patterned area or region of one or both of the mold 110 and the substrate 130.

In some embodiments, the spacers 120 are components separate from either the mold 110 or the substrate 130. In such embodiments, the spacers 120 are generally positioned, placed, or otherwise inserted between the mold 110 and the substrate 130 prior to establishing contact between the mold 110 and substrate 130 for the pattern transfer. For example, the spacers 120 may be separately fabricated from and then affixed to one or both of the mold 110 and the substrate 130 using glue, epoxy or other suitable means for joining.

In other embodiments, the spacers 120 are formed as an integral part of one or both of the mold 110 and the substrate 130. For example, the spacers 120 may be fabricated as an integral part of the mold 110 in some embodiments. In another example, the spacers 120 may be fabricated as an integral part of the substrate 130. In yet other examples, some of the spacers 120 may be formed as an integral part of one or both of the mold 110 and the substrate 130 while others of the spacers 120 are not integral to either the mold 110 or the substrate 130. A discussion of integral spacer fabrication as well as examples of materials that may be used therein is provided in Stewart et al., cited supra.

Whether separately provided or integrally fabricated (i.e., formed) as part of one or both of the mold 110 and the substrate 130, in some embodiments, the spacer 120 comprises a precisely controlled dimension. Specifically, the spacers 120 may be fabricated with a precisely controlled dimension for spacing apart or separating the mold 110 and the substrate 130, wherein the precisely controlled dimension is individually determined for each spacer 120, in some embodiments. As used herein, the term 'spacing dimension' refers to a dimension of the spacers 120 that controls the separation between the mold 110 and the substrate 130 when the spacers 120 are employed in the contact lithography apparatus 100. Thus, when the spacers 120 act together to separate the mold 110 from the substrate 130, the separation takes on a precisely controlled initial (i.e., pre-deformation) spacing equal to the spacing dimension of the spacers 120.

In some embodiments, the spacers 120 provide a pre-deformation spacing dimension (i.e., proximal relationship) in the range of about 0.01 microns ($\mu$m) to about 50 microns ($\mu$m). In other embodiments, the spacers 120 provide a spacing dimension in a range of about 0.1 microns ($\mu$m) to about 10 microns ($\mu$m). In yet other embodiments, the spacers 120 may provide essentially any spacing dimension that befits a particular contact lithography situation or application and still be within the scope of the various embodiments of the present invention.

As discussed above, one or more of the mold 110, the spacers 120 and the substrate 130 are 'deformable components' to provide for contact of the contacting surfaces 114, 134 during use of the contact lithography apparatus 100. In some embodiments, the deformable components of the contact lithography apparatus 100 may provide one or both of passive deformation and active deformation. Passively deformable components may exhibit one or both of plastic and elastic deformation. A discussion of passive deformation and active deformation as well as examples of materials that may be used to achieve passive/active deformation is provided in Stewart et al., cited supra.

Figure 2A:
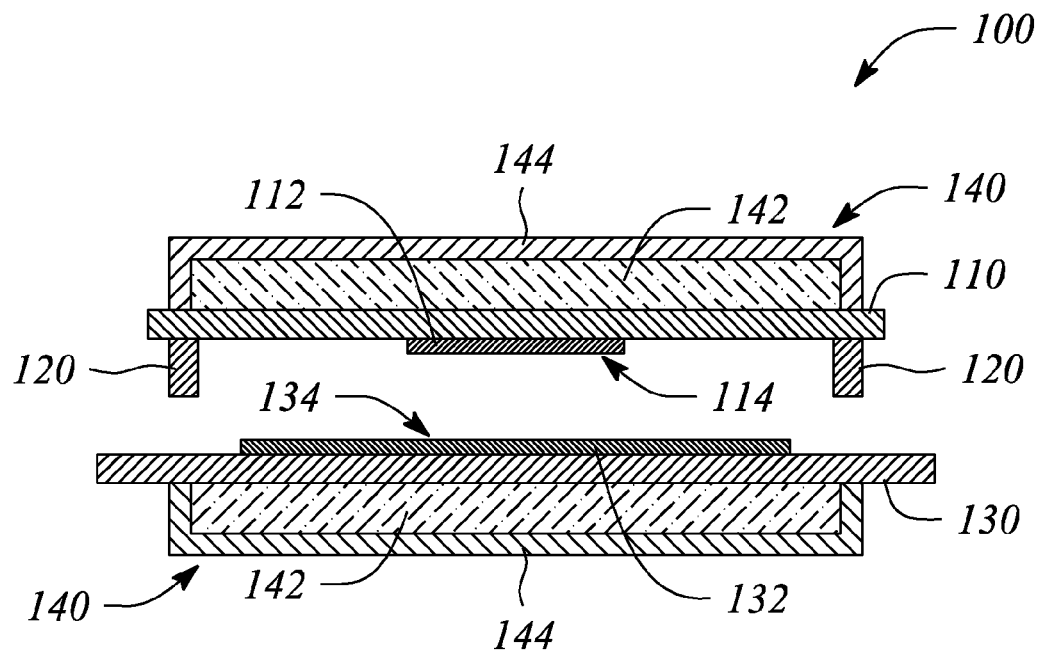
FIG. 2A illustrates a cross sectional view a contact lithography apparatus according to an embodiment of the present invention.

FIG. 2A illustrates a cross sectional view of a contact lithography apparatus 100 according to an embodiment of the present invention. As illustrated in FIG. 2A, the hydraulic force member 140 is adjacent to both an external surface of the mold 110 and an external surface of the substrate 130. The external surfaces are opposite to internal surfaces comprising the respective contacting surfaces 114, 134 of the mold 110 and the substrate 130 as illustrated in FIG. 2A.

Further, as illustrated in FIG. 2A, the hydraulic force member 140 comprises a housing 144 that contains the hydraulic liquid 142. The housing 144 is attached or affixed to the respective external surfaces of the mold 110 and the substrate 130. In particular, the housing 144 encloses and surrounds the hydraulic liquid 142 except at an interface with the respective external surfaces of the mold 110 and the substrate 130. At the respective external surfaces, the hydraulic liquid 142 is in direct contact with both the mold 110 and the substrate 130 in FIG. 2A, according to the illustrated embodiment. However, the hydraulic liquid 142 can be in direct contact with either of the mold 110 and the substrate 130, as further described below with respect to FIG. 2B, for example.

As used herein, the term 'external surfaces' generally refers to surfaces other than the contacting surfaces 114, 134. For example, in FIG. 2A, the contacting surface of the mold 114 is illustrated as a bottom surface of the mold 110 while the external surface is illustrated as a top surface of the mold 110.

In some embodiments, the hydraulic force member 140 further comprises a means for compression (not illustrated). The means for compression increases a pressure of the hydraulic liquid 142 within the housing 144 during contact lithography. The increased pressure applies a deformation force to the external surfaces that deform one or more of the mold 110, the spacers 120 and the substrate 130. For example, the means for compression may comprise one or more of a hydraulic pump and a reservoir of additional hydraulic liquid.

Figure 2B:
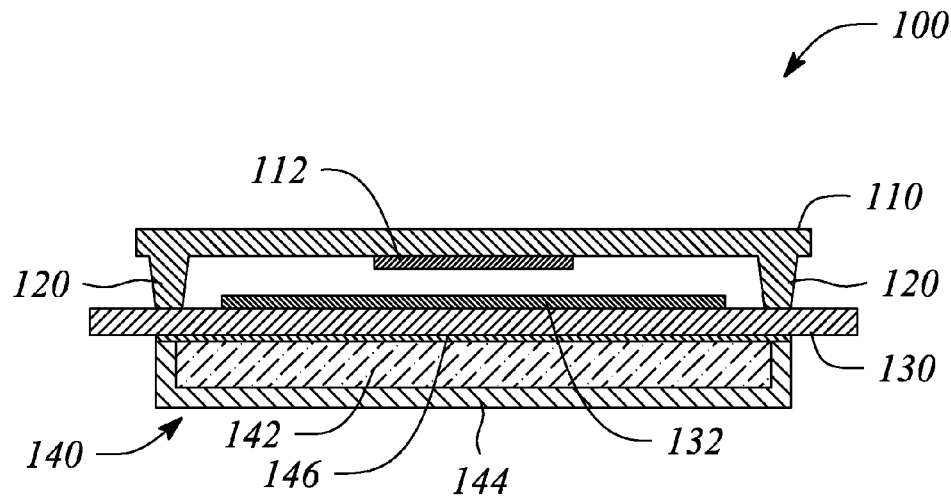
FIG. 2B illustrates a cross sectional view of a contact lithography apparatus according to another embodiment of the present invention.

FIG. 2B illustrates a cross sectional view of a contact lithography apparatus 100 according to another embodiment of the present invention. As illustrated in FIG. 2B, the hydraulic force member 140 is adjacent to the external surface of the substrate 130. The spacers 120 are illustrated integral to the mold 110 in FIG. 2B. Further, as illustrated in FIG. 2B, the hydraulic force member 140 comprises the hydraulic liquid 142, the housing 144 and a separator 146. The separator 146 is positioned between the hydraulic liquid 142 and the external surface of the substrate 130 at an interface between the hydraulic force member 140 and the substrate 130. As such, a contact between the external surface of the substrate 130 and the hydraulic liquid 142 is an indirect contact.

The separator 146 readily communicates or transfers a deformation force generated by the hydraulic liquid 142 to the external surface at the interface. In some embodiments, the separator 146 comprises a flexible membrane that is sealed to the housing 144 at a periphery thereof, for example. Materials suitable for fabricating the flexible membrane separator 146 include, but are not limited to, a metal sheet (e.g., comprising one or more of stainless steel and beryllium copper); a rubber sheet (e.g., comprising one or more of silicone rubber and latex rubber); a plastic sheet (e.g., comprising one or more of polypropylene and polyethylene); another polymeric sheet; and a crystalline or polycrystalline wafer (e.g., comprising one or more of sapphire, alumina, silicon and polysilicon). A seal at the periphery of the housing 144 may be provided by one or more of a weld, an adhesive (e.g., comprising one or more of an epoxy and a glue) and gasket between the housing 144 and the separator 146. The gasket seal may be one or more of clamped in place and adhered in place with an adhesive, for example.

In addition to a mechanical (i.e., force-transferring) connection at the interface, the separator 146 provides a thermal connection between the hydraulic liquid 142 and the substrate 130, according to some embodiments. As such, a material and a thickness of the separator 146 may be chosen to facilitate the thermal connection. In some embodiments, a thermal grease or similar thermal connection-enhancing compound may be employed at the interface between the separator 146 and the external surface of the substrate 130 to further facilitate the thermal connection.

In other embodiments (not illustrated), the separator 146 is operably connected to the housing 144. For example, the separator 146 may be an essentially rigid material that slides within or along an inner surface of the housing 144 in response to the deformation force provided by the hydraulic liquid 142. As such, the separator 146 may act as a piston and the housing 144 may act as a cylinder.

However, in contrast to the example of remote contact described above with respect to another exemplary piston/cylinder arrangement, the operably connected separator 146 described in these embodiments provides indirect contact between the hydraulic liquid 142 and the external surface to which it is adjacent. In particular, the operably connected separator 146 positions the hydraulic liquid 142 adjacent to the external surface and further provides an intimate contact therebetween by way of a material of the separator 146.

Figure 2C:
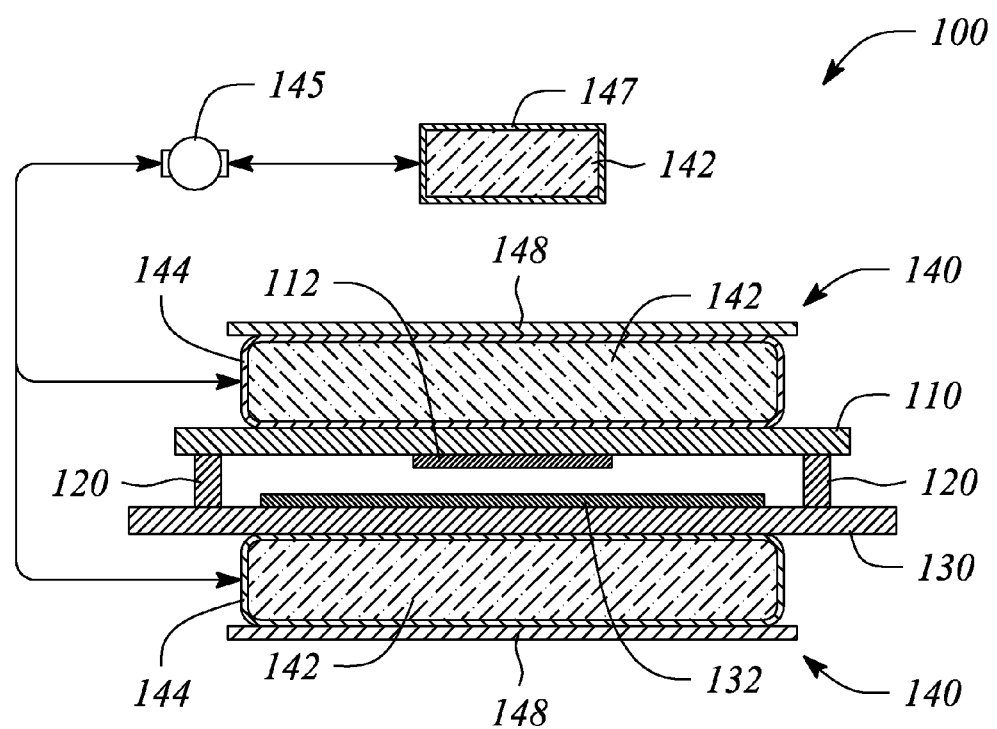
FIG. 2C illustrates a cross sectional view of a contact lithography apparatus according to another embodiment of the present invention.

FIG. 2C illustrates a cross sectional view of a contact lithography apparatus 100 according to yet another embodiment of the present invention. Exemplified in the embodiment of FIG. 2C, the hydraulic force member 140 is adjacent to both the substrate 130 and the mold 110. Further exemplified in the embodiment illustrated in FIG. 2C is that the housing 144 of the hydraulic force member 140 comprises a flexible bladder that essentially encloses the hydraulic liquid 142 on all sides. A surface of the bladder-type housing 144 is adjacent to the external surfaces of the mold 110 and the substrate 130, as illustrated in FIG. 2C. An increase in pressure of the hydraulic liquid 142 during contact lithography flexes or expands the bladder-type housing 144. The flexion or expansion, in turn, exerts a deformation force on the external surfaces. In some embodiments (not illustrated), the hydraulic force member 140 comprising the bladder-type housing 144 may be adjacent to only one of the respective external surfaces of either the mold 110 or the substrate 130.

Additionally, as illustrated in FIG. 2C, the hydraulic force member 140 further comprises the means for compression 148. In particular, as illustrated in FIG. 2C, the means for compression 148 comprises a fixed, essentially rigid plate or a similarly fixed structural member, along with a hydraulic pump 145 and a reservoir 147 of additional hydraulic liquid 142. The hydraulic pump 145 acts to increase the pressure of the hydraulic liquid 142 within the bladder-type housing 144 using the addition hydraulic liquid 142 from the reservoir 147. In such embodiments, the fixed structural member of the compression means 148 acts to resist the expansion of the bladder housing 144 in response to the increased pressure of the hydraulic liquid 142 provided by the hydraulic pump 145. As such, the expansion is constrained and therefore, preferentially directed toward the external surfaces. Although not illustrated, in some embodiments, the fixed structural member may extend down one or more sides of the bladder housing 144 to further constrain the expansion thereof.

In other embodiments, the means for compression 148 may comprise a movable plate or similar movable structural member. In such embodiments, the means for compression 148 acts to compress or exert a compressing force on the bladder housing 144 during contact lithography. For example, the means for compression 148 comprising a movable plate may compress the bladder-type housing 144 by essentially moving towards one or both of the external surfaces. The compression applied by the means for compression 148 may facilitate increasing the pressure of the hydraulic liquid 142, wherein the increase pressure, in turn, provides the deformation force that is applied to the external surfaces. In such embodiments, the means for compression 148 may further comprise a hydraulic pump and a reservoir.

Figure 2D:
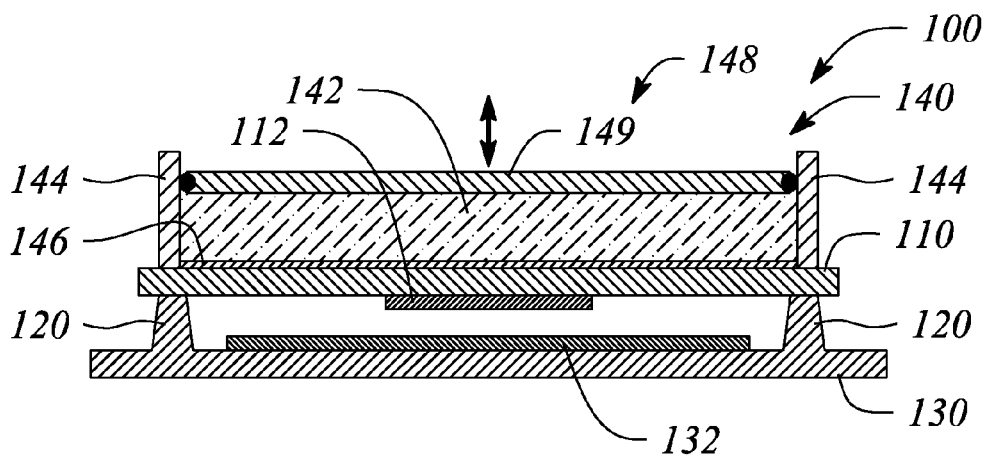
FIG. 2D illustrates a cross sectional view of a contact lithography apparatus according to another embodiment of the present invention.

FIG. 2D illustrates a cross sectional view of a contact lithography apparatus 100 according to another embodiment of the present invention. In this embodiment, the hydraulic force member 140 is adjacent to the external surface of the mold 110, for example. The hydraulic force member 140 comprises a rigid housing 144 enclosing the hydraulic liquid 142 and means for compression 148. The means for compression 148 illustrated in FIG. 2D comprises a movable structural member 149, movement of which acts to compress the hydraulic liquid 142.

In particular, as illustrated, the movable structural member 149 is operably connected to a distal end of the rigid housing 144, such that the movable structural member 149 can slide within walls of the rigid housing 144. For example, the movable structural member 148 may act as a piston while the housing 144 acts a cylinder. A two-headed arrow illustrated in FIG. 2D depicts movement of the movable structural member 149. A proximal end of the housing 144 is attached to the external surface of the mold 110, as illustrated FIG. 2D. A separator 146 covers the proximal end separating the hydraulic liquid 142 from the external surface of the mold 110, as illustrated in FIG. 2D.

When the movable structural member 149 moves toward the external surface of the mold 110 (as illustrated in FIG. 2D), the hydraulic liquid 142 is compressed. In turn, the compressed hydraulic liquid 142, having increased pressure, applies a deformation force to the mold 110 by way of the separator 146. In some embodiments (not illustrated), the separator 146 is omitted and the hydraulic liquid 142 is in direct contact rather than indirect contact with the external surface of the mold 110. In other embodiments, the means for compression 148 comprising the movable structural member 149 further comprise one or both of a hydraulic pump (not illustrated) and a reservoir of additional hydraulic liquid (not illustrated).

Figure 2E:
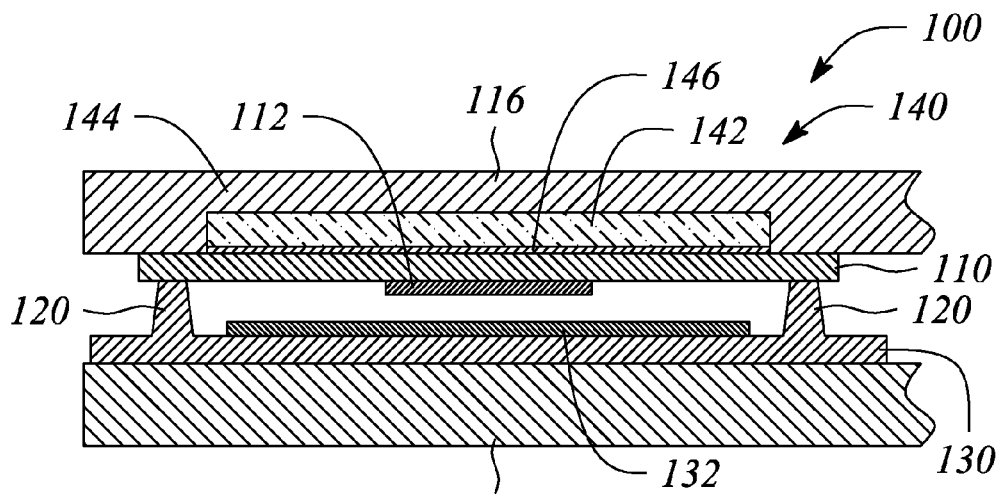
FIG. 2E illustrates a cross sectional view of a contact lithography apparatus according to another embodiment of the present invention.

FIG. 2E illustrates a cross sectional view of a contact lithography apparatus 100 according to an embodiment of the present invention. In this embodiment, the contact lithography apparatus 100 further comprises a mold frame 116 and a substrate chuck 136. The mold frame 116 holds and supports the mold 110. Similarly, the substrate chuck 136 holds and supports the substrate 130. Both of the mold 110 and the substrate 130 are removably held and supported by the respective frame 116 and chuck 136.

As further illustrated in FIG. 2E by way of example, the hydraulic force member 140 is integral to the mold frame 116. As such, the mold frame 116 comprises the hydraulic force member 140 and is or represents the respective housing 144 therefor. In particular, the mold frame 116 has a cavity that holds the hydraulic liquid 142. Also illustrated in FIG. 2E, the cavity is separated from the mold 110 by a membrane-type separator 146.

Figure 2F:
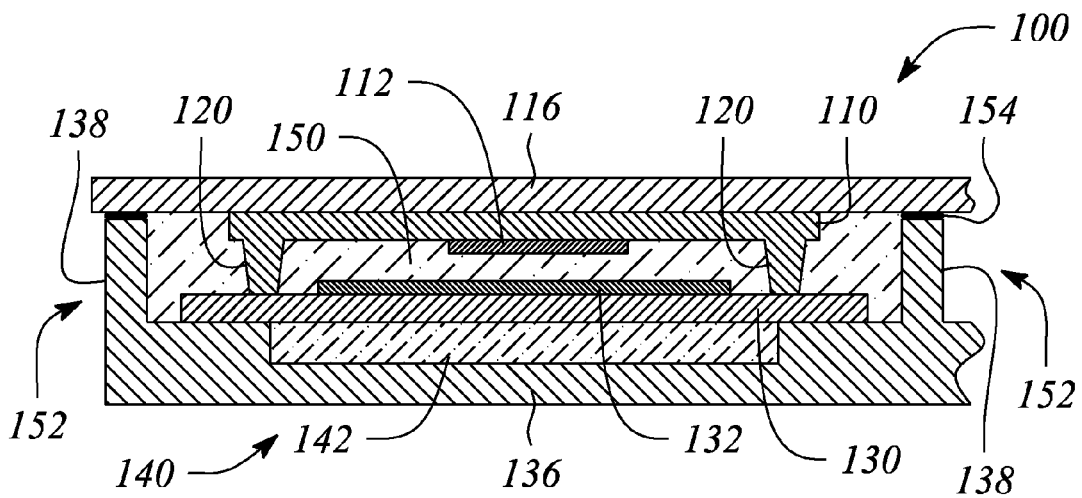
FIG. 2F illustrates a cross sectional view of a contact lithography apparatus according to another embodiment of the present invention.

FIG. 2F illustrates a cross sectional view of a contact lithography apparatus 100 according to an embodiment of the present invention. The contact lithography apparatus 100 in FIG. 2F differs from the contact lithography apparatus 100 illustrated in FIG. 2E in that the substrate chuck 136 comprises the hydraulic force member 140 having a cavity instead of the mold frame 116. Moreover, the contact lithography apparatus 100 in the embodiment illustrated in FIG. 2F further comprises an immersion liquid 150 between the mold 110 and the substrate 130.

The immersion liquid 150 thermally couples the mold 110 to the substrate 130 enhancing a thermo-stability of the contact lithography apparatus 100. The immersion liquid 150 comprises essentially any liquid material including, but not limited to, the liquids and fluids listed above for the hydraulic liquid 142. In some embodiments, the immersion liquid 150 is inert with respect to the mold 110 and the substrate 130. As such, the immersion liquid 150 does not interfere with the contact lithography or any of the materials of or patterns on the contacting surfaces of the mold 110 and substrate 130 in these embodiments. For example, if a water-insoluble pattern receiving material is employed on the substrate 130, the immersion liquid 150 may comprise water. In another example, Fluorinert™ may be employed as the immersion liquid 150 where an inherently inert material is desired. Fluorinert™ is also known to facilitate an excellent thermal connection between the mold 110 and the substrate 130.

The embodiment of the contact lithography apparatus 100 illustrated in FIG. 2F further comprises means for retaining 152 the immersion liquid 150. The means for retaining 152 retains the immersion liquid 150 in a space between the mold 110 and the substrate 130, and in some embodiments, between the mold frame 116 and the substrate chuck 136. In some embodiments, the means for retaining 152 comprises an extension wall 138 integral with the substrate chuck 136 and a gasket 154 between the mold frame 116 and the substrate chuck 136. The extension wall and the gasket 154 form a cavity that holds the immersion liquid 150 during contact lithography.

In some embodiments, an exhaust channel, overflow reservoir or similar means for relieving pressure (not illustrated) is provided to evacuate the immersion liquid 150 from between the mold 110 and the substrate 130 during the pattern transfer deformation of one or more of the mold 110, the spacers 120, and the substrate 130. In other embodiments, the means for retaining 152 comprises a compressible gasket (not illustrated) between the mold 110 and the substrate 130. The compressible gasket confines the immersion liquid 150 between the mold 110 and substrate 130. The compressible gasket may further provide means for pressure relief (e.g., a pressure relief valve or a pressure relief cavity), in some embodiments.

Figure 3A:
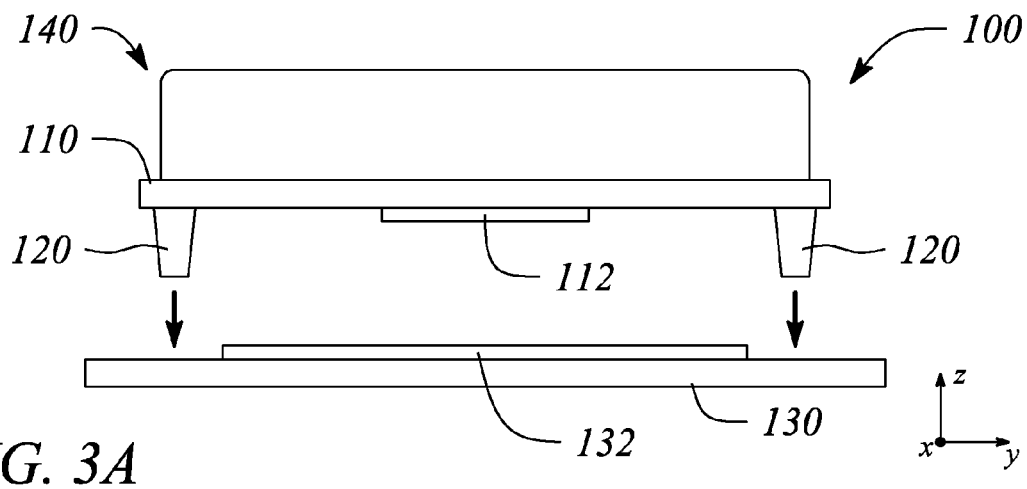
FIG. 3A illustrates a side view of a contact lithography apparatus according to an embodiment of the present invention.

FIG. 3A illustrates a side view of a contact lithography apparatus 100 according to an embodiment of the present invention. In the illustrated embodiment, the hydraulic force member 140 is adjacent to the mold 110. The side view illustrated in FIG. 3A depicts the contact lithography apparatus 100 in an exemplary open or initial configuration prior to initiating pattern transfer. As illustrated in FIG. 3A, the mold 110 and the substrate 130 are oriented in an x-y plane and spaced apart from one another along a z-axis direction of an exemplary Cartesian coordinate system.

Pattern transfer using the contact lithography apparatus 100 is initiated by moving one or both of the mold 110 and the substrate 130 in a z-direction toward each other until there is mutual contact with the spacers 120. In FIG. 3A, the mold 110 is moved toward the substrate 130 until the spacers 120 attached to the mold 110 contact the substrate 130, for example. A z-axis oriented arrow in FIG. 3A indicates motion of the mold 110 upon pattern transfer initiation in this embodiment. Although not illustrated, the substrate 130 may be moved in a z-direction toward the mold 110, either instead of or in addition to the mold 110 movement, and still be within the scope of the embodiments of the present invention.

In some embodiments, once mutual contact with the spacers 120 is achieved, the spacers 120 provide an essentially parallel separation between the mold 110 and the substrate 130 as described hereinabove. Specifically, the spacers 120 act to maintain a uniform distance and proximal relationship between the mold 110 and the substrate 130 with respect to the vertical or z-axis (z) as a result of the spacing dimension of the spacers 120.

Figure 3B:
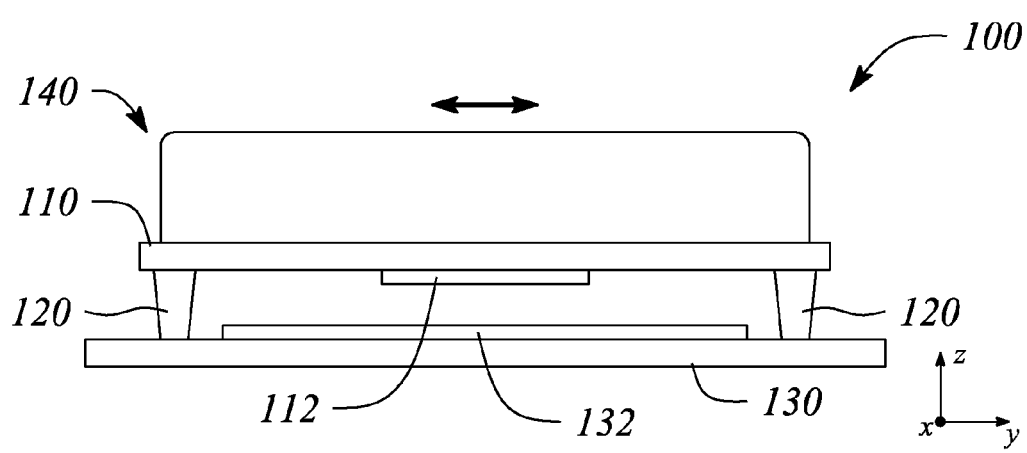
FIG. 3B illustrates a side view of the contact lithography apparatus of FIG. 3A in a closed configuration according to an embodiment of the present invention.

FIG. 3B illustrates a side view of the contact lithography apparatus 100 of FIG. 3A in a closed configuration according to an embodiment of the present invention. In particular, FIG. 3B illustrates the contact lithography apparatus 100 after initiation of pattern transfer. As illustrated in FIG. 3B, the mold 110 and the substrate 130 are in mutual contact with the spacers 120. The uniform distance between the spaced apart mold 110 and the substrate 130 in the closed configuration is essentially a spacing dimension of the spacers 120, as illustrated in FIG. 3B.

With the spacers 120 maintaining the parallel separation in the z-direction, one or both of a lateral alignment and an angular alignment (e.g., an x-y alignment and/or a rotational alignment) between the mold 110 and the substrate 130 may be accomplished. In particular, for the exemplary contact lithography apparatus 100 illustrated in FIGS. 3A and 3B, one or both of the mold 110 and the substrate 130 are moved in an x-y plane to accomplish alignment, which may include rotating in some embodiments. Mutual contact between the substrate 130, the spacers 120 and the mold 110 is maintained during such alignment. A two-headed arrow depicted in FIG. 3B indicates aligning the mold 110 and the substrate 130 one or both of laterally and angularly.

Figure 3C:
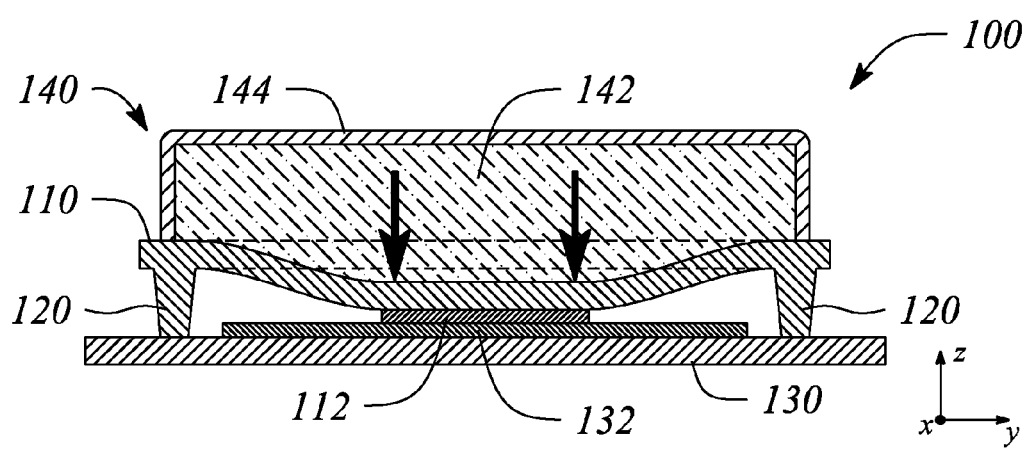
FIG. 3C illustrates a cross sectional view of the contact lithography apparatus of FIGS. 3A and 3B during pattern transfer according to an embodiment of the present invention.

FIG. 3C illustrates a cross sectional view of the contact lithography apparatus 100 of FIGS. 3A and 3B during pattern transfer according to an embodiment of the present invention in which flexure of the mold 110 is employed. The employed flexure is sufficient to bring the contacting surface 114 of the mold 110 into contact Is with the contacting surface 134 of the substrate 130. Thus, the flexure of the mold 110 induces a deflection sufficient to bring the patterned area 112 of the mold 110 in physical contact with the target portion 132 of the substrate 130.

Flexure is induced by a deformation force (vertical arrows) provided by the hydraulic force member 140. In particular, a pressure of the hydraulic liquid 142 in the housing 144 of the hydraulic force member 140 is increased. For example, a hydraulic pump (not illustrated) may be employed to add hydraulic liquid from a reservoir (not illustrated) to that enclosed by the housing 144. The increased hydraulic liquid increases the pressure in the housing 144. The increased pressure exerts the deformation force on the interface between the top surface of the mold 110 and the hydraulic force member 140. In this embodiment, the mold 110 is deformable. The deformation force flexes the mold 110 until the physical contact for pattern transfer is achieved. A contact pressure between contacting surfaces may be controlled by an amount of hydraulic liquid 142 that is added to the housing 144, for example.

Figure 3D:
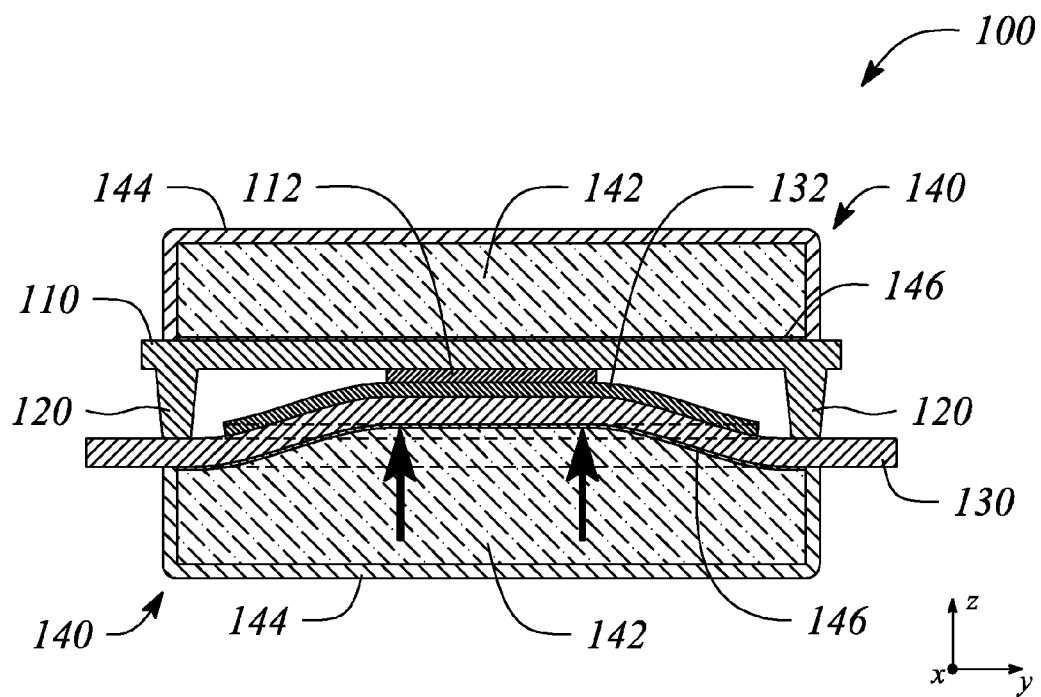
FIG. 3D illustrates a cross sectional view of a contact lithography apparatus during pattern transfer according to another embodiment of the present invention.

FIG. 3D illustrates a cross sectional view of a contact lithography apparatus 100 during pattern transfer according to another embodiment of the present invention. In this embodiment, the hydraulic force member 140 is attached to both a top surface of the mold 110 and a bottom surface of the substrate 130 in contrast to the embodiment illustrated in FIGS. 3B and 3C. Moreover, the substrate 130 is deformable in this embodiment and the mold 110 is essentially rigid.

Referring again to FIG. 3D, a pressure of the hydraulic liquid 142 is increased in the housing 144 adjacent to at least the substrate 130 during pattern transfer (as illustrated with vertical arrows). As such, since only the substrate 130 is deformable (i.e., the mold 110 is not deformable as illustrated in FIG. 3D), only the substrate 130 is deformed. The substrate flexure serves an equivalent purpose to that of the mold flexure illustrated in FIG. 3C. A separator 146 is illustrated in FIG. 3D between the hydraulic liquid 142 and both the top surface of the mold 110 and the bottom surface of the substrate 130, for example. FIGS. 3C and 3D illustrate examples in which a rigid spacer 120 is employed between the patterning tool or mold 110 and the substrate 130 being patterned.

In some embodiments, the pressure of the hydraulic liquid 142 adjacent to the top surface of the mold 110 may be essentially equal to the pressure of the hydraulic liquid 142 adjacent to the bottom surface of the substrate 130. For example, an upper cavity containing the hydraulic liquid 142 adjacent to the mold 110 may be connected by way of a channel, a hose or conduit (not illustrated), for example, to a lower cavity holding the hydraulic liquid 142 adjacent to the bottom surface of the substrate 130. The connection may equalize the pressure between the upper and lower cavities, for example. In other embodiments, the upper and lower respectively adjacent cavities may be separate or isolated from one another such that the pressure of the hydraulic liquid 142 in the respective cavities may be essentially established and changed independently.

Figure 3E:
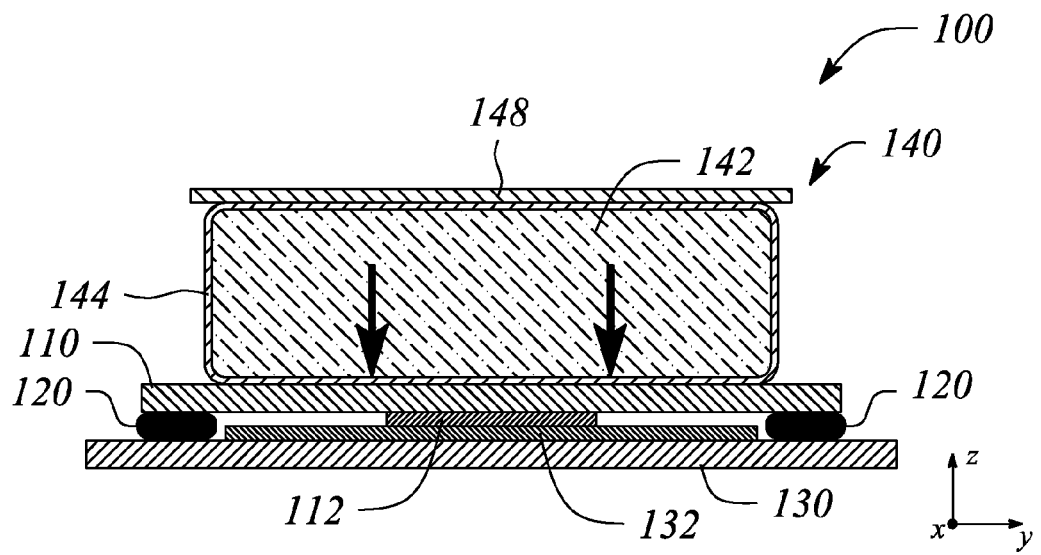
FIG. 3E illustrates a cross sectional view of a contact lithography apparatus during pattern transfer according to another embodiment of the present invention.

FIG. 3E illustrates a cross sectional view of a contact lithography apparatus 100 during pattern transfer according to another embodiment of the present invention. In particular, as illustrated in FIG. 3E, deformation of the spacer 120 is employed to facilitate pattern transfer. The contact lithography apparatus 100 illustrated in FIG. 3E comprises a bladder-style hydraulic force member 140 that is adjacent to the mold 110. The hydraulic force member 140 applies a deformation force (vertical arrows) that, acting through the mold 110, induces a deformation of the spacers 120. The deformed spacers 120 allow the patterned area 112 of the mold 110 to contact and press against the target portion 132 of the substrate 130 with the desired contact pressure.

While the applied deformation force generated by the hydraulic force member 140 is illustrated in FIG. 3E as generally applied to the mold 110, a hydraulic force member 140, and therefore the force, may be applied to the substrate 130 in lieu of or in addition to the mold 110 and still be within the scope of the various embodiments of the present invention. Moreover, while the applied force is illustrated in FIG. 3E generally as centrally located arrows adjacent to the mold 110, it is within the scope of the embodiments described herein for the force to be applied anywhere along the surface of the mold 110 and/or the substrate 130, such that deformation of the spacers 120 is induced.

Figure 4:
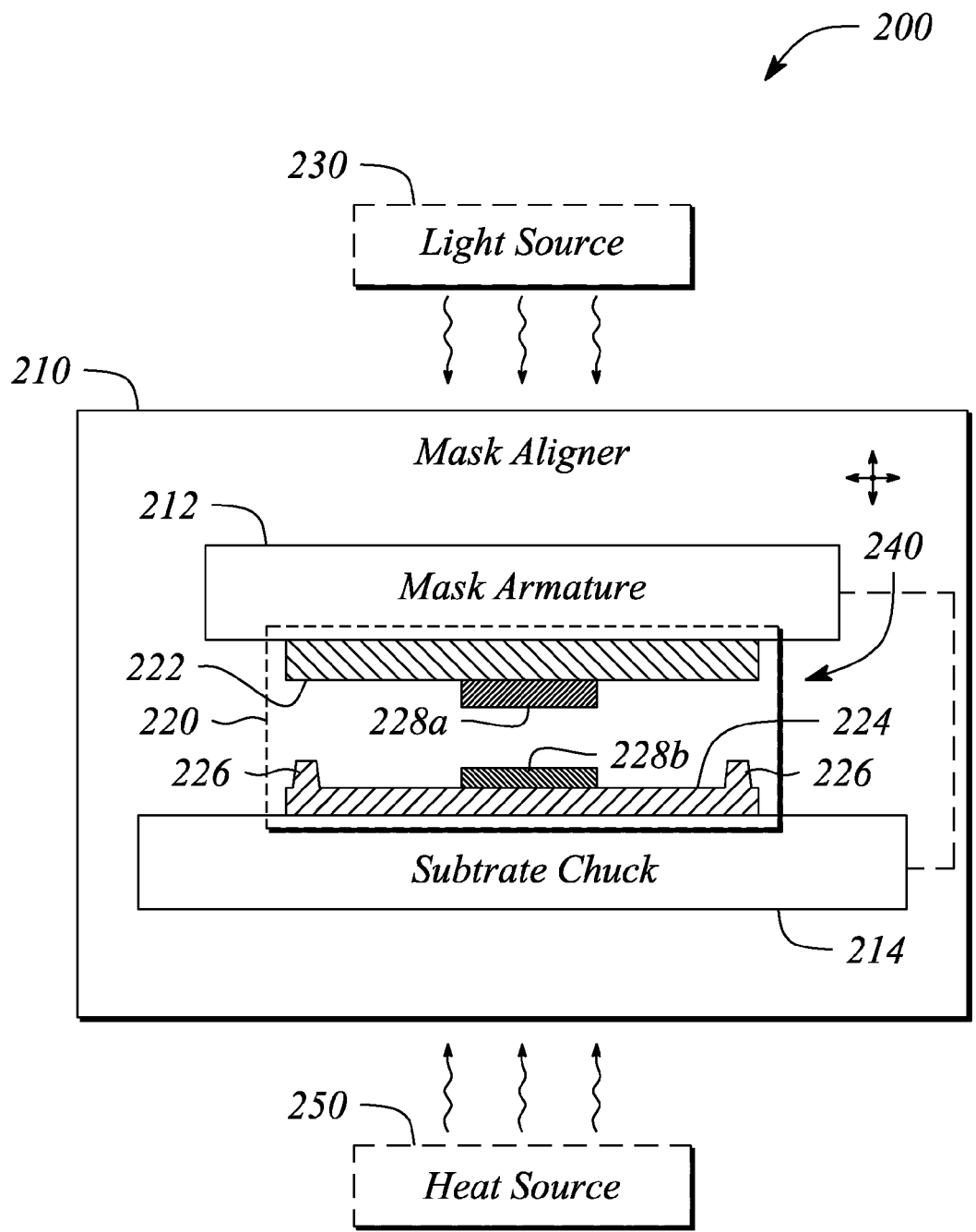
FIG. 4 illustrates a block diagram of a contact lithography system according to an embodiment of the present invention.

FIG. 4 illustrates a block diagram of a contact lithography system 200 according to an embodiment of the present invention. In particular, the contact lithography system 200 provides for one or more of a parallel alignment, a lateral alignment and a rotational alignment between a patterning tool (e.g., photolithographic mask, imprint lithography mold, or lithographic template) and a substrate to be patterned. Furthermore, the contact lithography system 200 facilitates patterning the substrate by direct contact between the patterning tool and the substrate. The facilitated patterning is accomplished through a flexure of one or more of the patterning tool, the substrate and a spacer that is between the patterning tool and the substrate, without substantially disturbing the alignment thereof. The contact lithography system 200 is applicable to any lithography methodology that involves contact between the patterning tool and the substrate being patterned including, but not limited to, photographic contact lithography, X-ray contact lithography, and imprint lithography. Hereinafter with respect to the contact lithography system 200, the patterning tool is referred to as a mask for simplicity of discussion and without loss of generality.

The contact lithography system 200 comprises a contact mask aligner 210 and a contact lithography module or apparatus 220. The contact mask aligner 210 holds the contact lithography module 220 during both lateral/rotational alignments and patterning. The contact mask aligner 210 comprises a mask armature 212 and a substrate chuck, platen, or stage 214. In some embodiments, the contact mask aligner 210 may include parts of a conventional mask aligner with a substrate chuck or stage for holding a substrate and a mask armature for holding a mask. In the conventional contact mask aligner, the mask armature and the substrate chuck are movable relative to one another to enable relative lateral and rotational alignments (e.g., x-y alignment and angular (ω) alignment) of a mask and a substrate. In some embodiments, relative alignments of a mask blank that incorporates or holds the mask are also enabled. The contact mask aligner 210 of the present invention differs from the conventional mask aligner in that the mask aligner 210 holds or supports the contact lithography module 220 of the present invention for substrate patterning, which is further described below. In addition, a relative motion between the mask armature and the substrate chuck that is conventionally employed to achieve a pattern-transferring contact between the mask and the substrate is also employed in various embodiments of the present invention. However, such conventional relative motion is employed in the embodiments of the present invention to close the contact lithography module 220, but not for pattern transfer. Instead, a deformation in the lithography module 220 is employed to provide a pattern-transferring contact in the closed contact lithography module 220 while the mask aligner 210 maintains alignment.

The contact lithography module 220 comprises a mold or mask blank 222, a substrate carrier 224, and one or more spacers 226. In some embodiments, the mask blank 222 comprises a flexible plate that provides a mounting surface for a patterning tool or 'mask' 228a. In some of such embodiments, the mask 228a may be either flexible, semi-rigid or essentially rigid (i.e., essentially non-deformable). In such embodiments, the mask 228a may be removably affixed to the mounting surface of the mask blank 222 using an adhesive or a means for mechanical fastening, for example, such as clamps or clips, or using a vacuum. In other embodiments, the mask blank 222 is a rigid plate or a semi-rigid plate and the mask 228a is flexible. In such embodiments, the mask 228a is removably affixed to a mounting surface of the mask blank 222 in a manner that facilitates flexing of the flexible mask 228a. In yet other embodiments, the mask 228a may be formed in or is fabricated as part of the mask blank 222. In such embodiments, the mask blank 222 may be considered essentially equivalent to the mask 228a. The flexibility of one or both of the mask blank 222 and the mask 228a is employed to facilitate the pattern-transferring contact in some embodiments, as described further below.

In some embodiments, the substrate carrier 224 is a rigid or semi-rigid plate that provides a mounting surface for a substrate 228b. The substrate 228b is removably affixed to the mounting surface of the substrate carrier 224. For example, an adhesive or a mechanical fastener may be employed to affix the substrate 228b to the substrate carrier 224. In another example, a vacuum, electromagnetic, or similar force known in the art may be employed to affix the substrate 228b to the carrier 224.

In some embodiments, the substrate 228b is flexible and may be affixed to the mounting surface in a manner that facilitates flexing. For example, the substrate 228b may be affixed only around a perimeter of the substrate 228b. Alternatively, the substrate 228b may be affixed only until flexing is needed. For example, a vacuum holding the substrate 228b may be released or turned off to facilitate flexing.

In other embodiments, the substrate carrier 224 comprises a flexible plate to which the substrate is removably affixed. In such embodiments, the substrate 228b may be flexible, semi-rigid or essentially rigid (i.e., essentially non-deformable). In yet other embodiments, the substrate 228b itself may act as the substrate carrier 224. In any case, the flexibility of one or both of the substrate carrier 224 (when present) and the substrate 228b is employed to facilitate the pattern-transferring contact in some embodiments.

The contact lithography module 220 further comprises a hydraulic force member 240. The hydraulic force member 240 contains hydraulic liquid. The hydraulic liquid is positioned within the hydraulic force member 240 to be directly or indirectly adjacent to one or both of the mask 228a and the substrate 228b, depending on whether the mask blank 222 and the substrate carrier 224 are included. In some embodiments, the hydraulic liquid 242 is positioned to be in direct contact with one or both of the mask 228a and the substrate 228b while in other embodiments the positioning provides indirect contact. The hydraulic force member 240 supplies a deformation force during flexure-facilitated contact lithography.

In some embodiments, the contact lithography module 220 is essentially similar to the contact lithography apparatus 100 described hereinabove. In such embodiments, the mask blank 222 and the mask 228a together are essentially similar to the mold frame 116 and the mold 110, while the substrate carrier 224 and the substrate 228b are essentially similar to the substrate chuck 136 and substrate 130, and the spacers 226 are essentially similar to the spacers 120 described herein above with respect to the various embodiments of the contact lithography apparatus 100. Further, the hydraulic force member 240 and the hydraulic liquid are essentially similar to the hydraulic force member 140 and the hydraulic liquid 142, respectively, of the contact lithography apparatus 100.

Figure 5A:
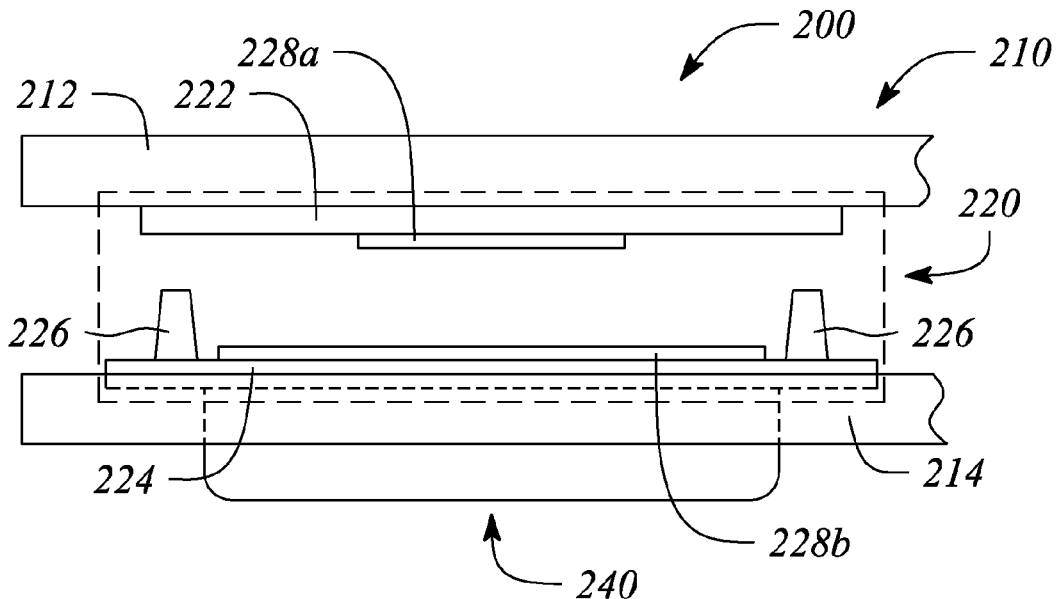
FIG. 5A illustrates a side view of a mask aligner portion of the contact lithography system of FIG. 4 according to an embodiment of the present invention wherein a contact lithography module is in an initial, open configuration.

FIG. 5A illustrates a side view of a mask aligner 210 portion of the contact lithography system 200 of FIG. 4 according to an embodiment of the present invention wherein the contact lithography module 220 is in an initial, open configuration. As illustrated in FIG. 5A, the spacers 226 are conical-shaped in this embodiment and adjacent to or on the substrate carrier 224, for example. A dashed line essentially encloses the illustrated elements of the lithography module 220 in FIG. 5A. Additionally, only the portion of the mask aligner 210 in a vicinity of the lithography module 220 is illustrated in FIG. 5A.

Figure 5B:
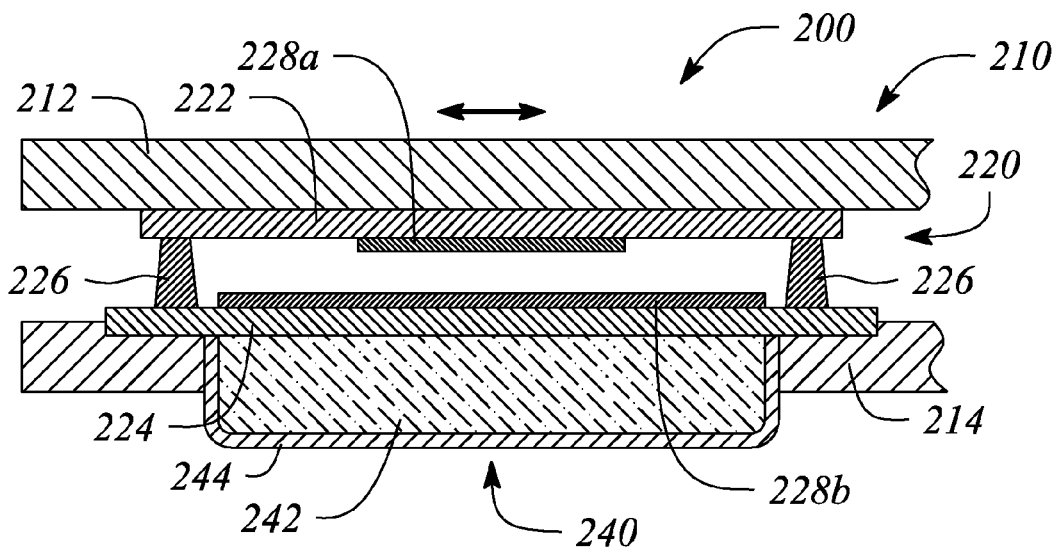
FIG. 5B illustrates a cross sectional view of the mask aligner portion of FIG. 5A according to an embodiment of the present invention wherein the contact lithography module is in a closed configuration.

FIG. 5B illustrates a cross sectional view of the mask aligner 210 portion of FIG. 5A according to an embodiment of the present invention wherein the contact lithography module 220 is in a closed configuration. In some embodiments, the closed configuration is achieved by moving the mask armature 212 and the substrate chuck 214 toward one another to bring the mask blank 222 and substrate carrier 224 in mutual contact with the spacers 226. The movement of the mask armature 212 and the substrate chuck 214 may comprise moving one or both of the armature 212 and the chuck 214 relative to a reference frame of the mask aligner 210. Such movement is consistent with conventional operation of a mask aligner that brings an aligned mask in contact with a resist covered substrate. In the closed configuration of the contact lithography module 220, the mask 228a is separated from the substrate 228b, such that there is clearance or a space between one or both of a feature extending from the mask 228a in a direction toward the substrate 228b and a feature extending from the substrate 228b in a direction toward the mask 228a when closed. In the closed configuration, the clearance or space is provided by the spacers 226.

The closed configuration of the contact lithography module 220 facilitates alignment of the mask 228a and the substrate 228b using a conventional operation of the mask aligner 210 in a way similar to mask alignment known in the art. Specifically, alignment (i.e., lateral alignment and rotational alignment) is provided by a relative motion (e.g., x-y motion and angular motion) of one or both of the mask blank 222 and the substrate carrier 224. However, unlike the conventional mask aligner operation, the relative motion is provided by sliding one or both of the mask blank 222 and substrate carrier 224 on a 'slideable contact' between the spacers 226 and a surface of one or both of the mask blank 222 and the substrate carrier 224 that may include a surface of the mask 228a and/or the substrate 228b, depending on the embodiment.

Moreover, unlike the conventional mask aligner operation, the relative motion is provided by the low-friction interface or 'slideable contact' (i.e., the interface being one or both of smooth slideable) between the spacers 226 and the respective surface(s). Furthermore, the mask blank 222 and the substrate carrier 224 are held essentially parallel to one another by the separating action of the spacers 226, according to some embodiments. Sliding on the slideable contact maintains the essentially parallel relationship between the mask blank 222 and the substrate carrier 224 throughout and the alignment. A double-headed arrow illustrated in FIG. 5B indicates the relative motion (e.g., x-y motion and angular motion) of the mask blank 222 and/or the substrate carrier 224 during alignment.

Figure 5C:
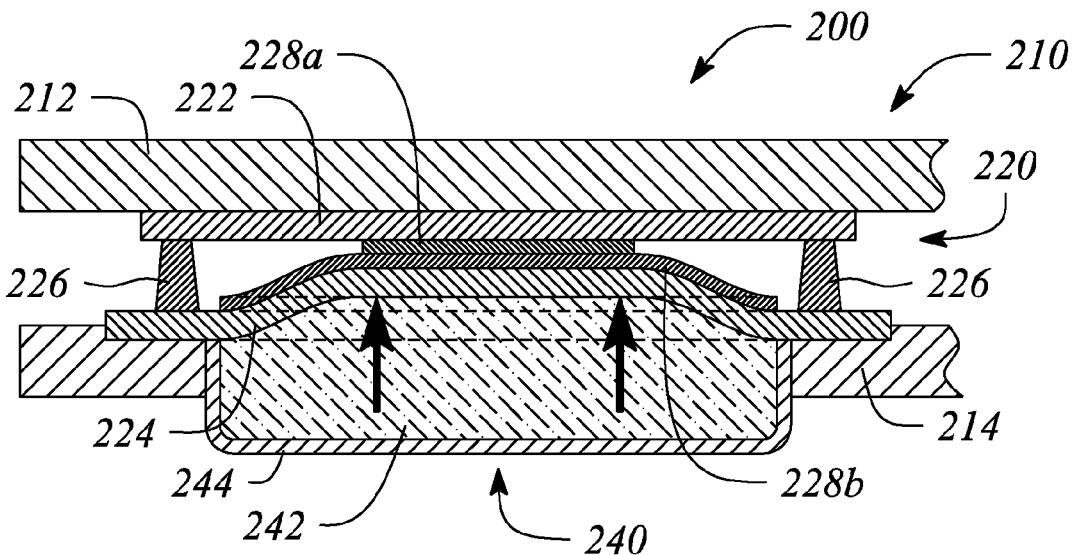
FIG. 5C illustrates a cross sectional view of the mask aligner portion of FIG. 5B during pattern transfer according to an embodiment of the present invention.

FIG. 5C illustrates a cross sectional view of the mask aligner 210 portion of FIG. 5B during pattern transfer according to an embodiment of the present invention. In particular, FIG. 5C illustrates the hydraulic force member 240 applying the deformation force to induce flexure of a flexible substrate carrier 224 according to an embodiment of the present invention. For example, a pressure of the hydraulic liquid 242 within the hydraulic force member 240 may be increased by the hydraulic force member 240 to provide the deformation force (vertical arrows). The induced deformation facilitates a physical contact between the mask 228a and the substrate 228b, as illustrated in FIG. 5C.

FIG. 5C further illustrates that the substrate 228b also flexes with the flexure of the substrate carrier 224 according to an embodiment. Further illustrated is a direct contact between the hydraulic liquid 242 and the substrate carrier 224. The direct contact between the hydraulic liquid 242 and the substrate carrier 224 is illustrative of a corresponding indirect contact between the hydraulic liquid 242 and the substrate 228b, as illustrated in FIGS. 5A-5C. FIG. 5C also illustrates a rigid spacer 226 disposed between and in mutual contact with the mask blank 222 and substrate carrier 224 (i.e., deformable lithographic elements) during pattern transfer.

In some embodiments, the mask blank 222 and the mask 228a are essentially transparent to light or X-ray to facilitate exposing a photoresist layer on the substrate 228b through the mask 228a as in photolithography, for example. Alternatively, the mask blank 222 has an opening while the mask 228a is transparent. In some embodiments, the substrate carrier 224 and the substrate 228b are essentially transparent to light or X-ray. Alternatively, the substrate carrier 224 has an opening while the substrate 228b is transparent. In other embodiments, one or both of the mask blank 222 and the substrate carrier 224 are essentially transparent to light or have an opening to facilitate photo-curing or to facilitate photo-softening of a moldable layer on a surface of the substrate 228b as in imprint lithography, for example. In such embodiments, the contact lithography system 200 further comprises an irradiative source 230, as illustrated in FIG. 4. (e.g., infrared, visible, and/or ultraviolet (UV) light or alternatively an X-ray source).

Similarly, the hydraulic force member 240 is generally transparent or provides a means for transmitting light or X-ray radiation through the hydraulic force member 240 and into an adjacent one or more of the mask blank 222, the mask 228a, the substrate carrier 224, and substrate 228b, depending on the embodiment. The transmitted light or X-ray radiation similarly facilitates photo-curing and/or photo softening. The transparency of the hydraulic force member 240 may further facilitate optical alignment of the mask 228a and the substrate 228b, in some embodiments. FIG. 4 illustrates an optional irradiative source 230, for example.

In other embodiments, the moldable layer on the substrate 228b is cured using heat or softened using heat followed by cooling. In such embodiments, the contact lithography system 200 further comprises a heat source 250 that applies heat for the moldable layer during imprinting, also illustrated in FIG. 4 as an option by way of a non-limitative example. In some embodiments, the contact lithography system 200 comprises both an irradiative source 230 and a heat source 250, such that one or more of heat curing/softening of the moldable layer, photo-curing/softening of the moldable layer and photo-exposure is enabled respectively during photolithography and imprint lithography. Thus, in some embodiments, the contact lithography system 200 is essentially a turn-key system that provides alignment, contact lithography (e.g., one or both of photo- and imprint lithography) using deformation, as described above, and curing of a receiving layer in a single setup. Further, a controllable contact pressure, facilitated by the elements of the contact lithography module 220 embodiments, provides uniform pattern transfer.

Figure 6:
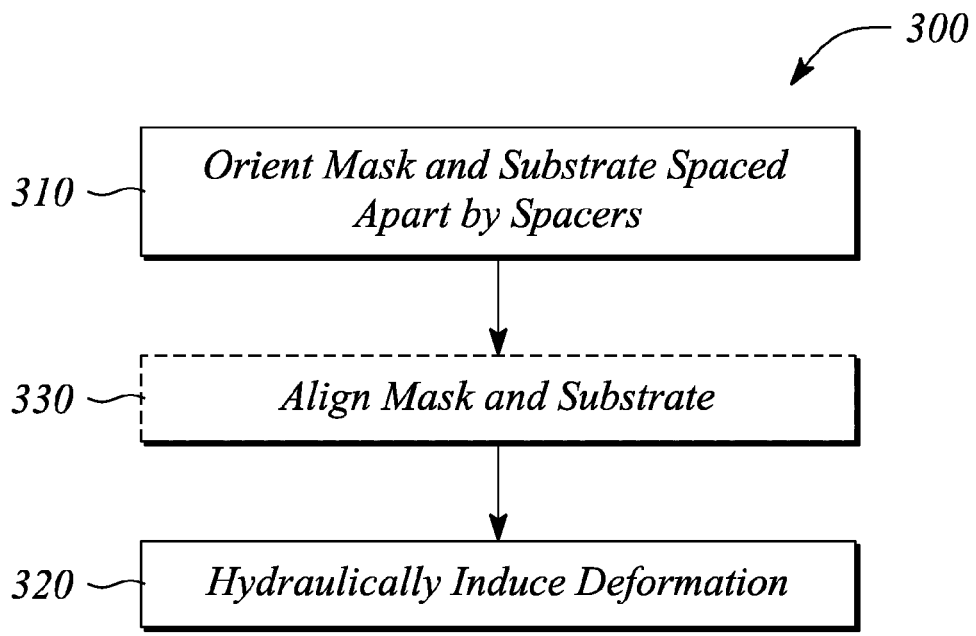
FIG. 6 illustrates a flow chart of a method of contact lithography according to an embodiment of the present invention.

FIG. 6 illustrates a flow chart of a method 300 of contact lithography according to an embodiment of the present invention. The method 300 comprises orienting 310 a patterning tool (e.g., mold or mask) and a substrate being patterned in a spaced apart relationship using dimensioned spacers. The spacers initially prevent direct contact between a patterned portion of the patterning tool and a target portion of the substrate. For example, when oriented 310, a maximum feature height of the patterning tool is spaced apart from or clears a maximum feature height of the substrate. In some embodiments, during and after orienting 310, the spacers further provide and maintain an essentially parallel relationship between the patterning tool and the substrate. For example, a planar surface of the patterning tool is made to be essentially parallel to a planar surface of the substrate by a relative spacing dimension of the spacers after orienting 310.

The method 300 further comprises hydraulically inducing 320 deformation of one or more of the patterning tool, the substrate and the spacers, such that the patterned portion of the patterning tool and the target portion of the substrate are brought into direct contact. Hydraulically inducing 320 deformation comprises using a hydraulic liquid to apply hydraulic pressure as a deforming force to one or both of the patterning tool and the substrate. The hydraulic liquid is adjacent to and in contact with one or both of the patterning tool and the substrate. The contact is either direct contact or indirect contact. The contact facilitates applying the respective hydraulic pressure. The applied hydraulic pressure one or more of flexes the patterning tool in a direction toward the substrate, flexes the substrate in a direction toward the patterning tool, and deforms or collapses the spacer. In other words, the hydraulically induced 320 deformation facilitates moving one or both of a portion of the patterning tool and a portion of the substrate across a space created by the spacers during orienting 310. The facilitated movement brings the respective patterning tool portion in direct contact with the respective substrate portion for pattern transfer.

In some embodiments, using a hydraulic liquid to apply hydraulic pressure as a deforming force comprises pumping additional hydraulic liquid from a reservoir with a hydraulic pump into a hydraulic liquid supply that is adjacent to one or both of the patterning tool and the substrate. In other embodiments, the hydraulic pressure is provided by mechanically compressing the adjacent hydraulic liquid supply. In yet other embodiments, a combination of adding to and compressing the adjacent hydraulic liquid supply is employed.

In some embodiments, the patterning tool is a lithographic mask employed in photolithographic patterning of the substrate while the mask is in the direct contact with the substrate or a pattern receiving layer of the substrate (e.g., optical contact lithography, X-ray contact lithography, etc.). In other embodiments, the patterning tool is a mold employed in printing or impressing a pattern onto a pattern receiving surface of the substrate during the direct contact (e.g., imprint lithography). The direct contact resulting from the hydraulically induced 320 deformation transfers a copy of the lithographic pattern to the substrate.

In some embodiments, the method 300 of contact lithography optionally further comprises aligning 330 the patterning tool and the substrate following orienting 310 but prior to hydraulically inducing 320 deformation. Performing an alignment 330 comprises one or more of lateral alignment and rotational alignment of one or both of the patterning tool and the substrate relative to each other. In such embodiments, one or both of lateral alignment and rotational alignment comprises sliding one or both of the patterning tool and the substrate on the spacers. An interface between the spacers and one or both of the patterning tool and the substrate is slideable (i.e., smooth or low friction) to facilitate sliding.

Thus, there have been described embodiments of an apparatus, a system and a method of contact lithography that employ spacers and hydraulically induced flexure to achieve patterning tool/substrate contact. It should be understood that the above-described embodiments are merely illustrative of some of the many specific embodiments that represent the principles of the present invention. Clearly, those skilled in the art can readily devise numerous other arrangements without departing from the scope of the present invention as defined by the following claims.

What is claimed is:

1. A contact lithography apparatus comprising:
   a patterning tool having a patterned area with a lithographic pattern;
   a substrate being patterned;
   a rigid spacer disposed between the patterning tool and the substrate, the rigid spacer being configured to be in mutual contact with the patterning tool and the substrate during pattern transfer; and
   a hydraulic force member adjacent to one or both of the patterning tool and the substrate configured to apply a hydraulic deformation force,
   wherein one or both of the patterning tool and the substrate is deformable under the hydraulic deformation force during pattern transfer, such that hydraulic deformation facilitates pattern transfer.

2. The contact lithography apparatus of claim 1, wherein the hydraulic force member comprises:
   a hydraulic liquid contained in a housing,
   wherein a pressure of the hydraulic liquid exerts the hydraulic deformation force to induce the hydraulic deformation.

3. The contact lithography apparatus of claim 2, wherein the hydraulic liquid is in contact with a surface of one or both of the patterning tool and the substrate.

4. The contact lithography apparatus of claim 3, wherein the hydraulic liquid is in direct contact with the surface.

5. The contact lithography apparatus of claim 2, wherein the hydraulic liquid enhances one or both of a thermo-stability of the contact lithography apparatus and a vibrational stability of the contact lithography apparatus, the stability facilitating maintaining an alignment during contact lithography.

6. The contact lithography apparatus of claim 1, wherein the hydraulic force member comprises:
   a hydraulic liquid; and
   a housing containing the hydraulic liquid, the housing being adjacent to an external surface of one or both of the patterning tool and the substrate,
   wherein a pressure of the hydraulic liquid within the housing exerts the hydraulic deformation force on an interface between the hydraulic force member and the adjacent external surface.

7. The contact lithography apparatus of claim 6, wherein the hydraulic force member further comprises:
   a separator at the interface, the separator separating the hydraulic liquid from the external surface.

8. The contact lithography apparatus of claim 6, wherein the hydraulic force member further comprises:
   means for compression,
   wherein the means for compression increases the pressure of the hydraulic liquid.

9. The contact lithography apparatus of claim 8, wherein the means for compression comprises one or both of a hydraulic pump and a reservoir of hydraulic liquid.

10. The contact lithography apparatus of claim 8, wherein the means for compression comprises a movable structural member that acts to compress the hydraulic liquid to increase the pressure.

11. The contact lithography apparatus of claim 6, wherein the housing comprises a flexible bladder adjacent to the external surface.

12. The contact lithography apparatus of claim 1, further comprising:
   a mold frame that holds and supports the patterning tool; and
   a substrate chuck that holds and supports the substrate,
   wherein the hydraulic force member is integral to one or both of the mold frame and the substrate chuck.

13. The contact lithography apparatus of claim 1, further comprising:
   an immersion liquid between the patterning tool and the substrate,
   wherein the immersion liquid thermally connects the patterning tool and the substrate to facilitate a thermo-stability of the contact lithography apparatus.

14. The contact lithography apparatus of claim 1 used in a contact lithography system, the system comprising a contact mask aligner that aligns the patterning tool and the substrate of the apparatus, the aligner supporting the apparatus during the hydraulic deformation-facilitated pattern transfer.

15. A contact lithography system comprising:
   a contact lithography module comprising a rigid spacer, a plurality of lithographic elements and a hydraulic force member, the rigid spacer being located between the lithographic elements, the hydraulic force member being adjacent to one or more of the lithographic elements; and
   a contact mask aligner that supports the contact lithography module,
   wherein the rigid spacer is configured to be in mutual contact with the lithographic elements during an alignment of the lithographic elements by the aligner and during pattern transfer, and
   wherein a hydraulic force of the hydraulic force member is configured to produce a hydraulic deformation in one or more of the lithographic elements of the module during pattern transfer while the aligner holds the lithographic elements in alignment.

16. The contact lithography system of claim 15, wherein the plurality of lithographic elements comprises:
   a patterning tool having a lithographic pattern in a patterned area; and a substrate being patterned, wherein the rigid spacer is dimensioned to create a constant and unvarying space between the patterning tool and the substrate when the patterning tool and the substrate are in mutual contact with the rigid spacer during the alignment, and wherein hydraulic liquid of the hydraulic force member is in contact with one or both of the patterning tool and the substrate, the contact being one of a direct contact or an indirect contact.

17. The contact lithography system of claim 16, wherein one or both of the patterning tool and the substrate deform in response to the hydraulic force, such that the hydraulic deformation produces a direct contact between the patterning tool and the substrate to facilitate pattern transfer without a change in dimension of the rigid spacer.

18. A method of contact lithography comprising:

orienting a lithographic patterning tool and a substrate being patterned in a spaced apart relationship using a dimensioned spacer that is rigid, the patterning tool and the substrate being in mutual contact with the dimensioned spacer, which is disposed between the patterning tool and the substrate; and hydraulically inducing a deformation of one or both of the patterning tool and the substrate, such that the patterning tool and the substrate are brought into direct contact for pattern transfer without a dimensional change in the dimensioned spacer.

19. The method of contact lithography of claim 18, wherein hydraulically inducing a deformation comprises using a hydraulic liquid to apply hydraulic pressure as a deforming force, wherein the deforming force one or both of flexes the patterning tool and flexes the substrate to close a space between the patterning tool and the substrate that is created by the dimensioned spacer without a change in the spacer dimension, the hydraulic liquid being adjacent to one or both of the patterning tool and the substrate.

20. The method of contact lithography of claim 18, further comprising aligning the patterning tool and the substrate before the deformation is hydraulically induced, wherein aligning comprises one or both of a lateral alignment and a rotational alignment between the patterning tool and the substrate while maintaining the spaced apart relationship.

* * * * *